United States Patent [19]

Ueki et al.

[11] Patent Number: 4,861,623

[45] Date of Patent: Aug. 29, 1989

[54] METHOD FOR FORMING DEPOSITED FILM BY GENERATING PRECURSOR WITH HALOGENIC OXIDIZING AGENT

[75] Inventors: Masao Ueki, Urayasu; Masaaki Hirooka, Toride; Junichi Hanna; Isamu Shimizu, both of Yokohama, all of Japan

[73] Assignee: Canon Kabushiki Kaisha, Tokyo, Japan

[21] Appl. No.: 942,209

[22] Filed: Dec. 16, 1986

[30] Foreign Application Priority Data

Dec. 18, 1985 [JP] Japan ................ 60-285278

[51] Int. Cl.$^4$ .................. B05D 5/06; B05D 5/12; C23C 16/42

[52] U.S. Cl. .................... 427/69; 427/70; 427/250; 427/252; 427/253; 427/255; 427/255.2

[58] Field of Search ............. 427/255.2, 255.3, 255, 427/126.1, 95, 93, 87, 70, 69, 252, 250, 253; 437/225, 245, 246

[56] References Cited

U.S. PATENT DOCUMENTS

| | | | |
|---|---|---|---|
| Re. 31,708 | 10/1984 | Gordon | 427/126.2 |
| 2,552,626 | 5/1951 | Fisher et al. | 427/255.2 |
| 3,083,550 | 4/1963 | Averbach | 65/3 |
| 3,188,230 | 6/1965 | Bakish et al. | 117/107.1 |
| 3,203,827 | 8/1965 | Hill | 117/107.2 |
| 3,218,204 | 11/1965 | Ruehrwein | 148/175 |
| 3,224,912 | 12/1965 | Ruehrwein | 148/175 |
| 3,306,768 | 2/1967 | Peterson | 427/255.2 |
| 3,466,191 | 9/1969 | Stinchfield et al. | 117/213 |
| 3,506,556 | 4/1970 | Illery et al. | 204/192 |
| 3,655,429 | 4/1972 | Deklerk | 117/106 |
| 3,664,866 | 5/1972 | Manasevit | 117/201 |
| 3,850,679 | 11/1974 | Sopko et al. | 117/106 |
| 3,870,558 | 3/1975 | Shimizu et al. | 117/201 |
| 3,984,587 | 10/1976 | Lipp | 427/70 |
| 4,058,430 | 11/1977 | Suntola et al. | 156/611 |
| 4,096,822 | 6/1978 | Yamawaki et al. | 118/48 |
| 4,146,657 | 3/1979 | Gordon | 427/126 |
| 4,180,596 | 12/1979 | Crowder et al. | 427/255.2 |
| 4,206,252 | 6/1980 | Gordon | 427/160 |
| 4,239,811 | 12/1980 | Kemlage | 427/95 |
| 4,282,267 | 8/1981 | Kuyel | 427/38 |
| 4,328,261 | 5/1982 | Heinecke et al. | 427/255.2 |
| 4,357,179 | 11/1982 | Adams et al. | 148/1.5 |
| 4,359,490 | 11/1982 | Lehrer | 427/255.2 |
| 4,402,762 | 9/1983 | John et al. | 148/1.5 |
| 4,416,217 | 11/1983 | Nakamura et al. | 118/696 |
| 4,422,407 | 12/1983 | Bessot et al. | 118/723 |
| 4,448,801 | 5/1984 | Fukuda et al. | 427/87 |
| 4,515,107 | 5/1985 | Fournier et al. | 118/718 |
| 4,522,663 | 6/1985 | Ovshinsky et al. | 148/403 |
| 4,526,809 | 7/1985 | Hall et al. | 427/74 |
| 4,529,679 | 7/1985 | Ogawa et al. | 427/74 |
| 4,554,180 | 11/1985 | Hirooka | 427/248.1 |
| 4,595,601 | 6/1986 | Horioka et al. | 427/94 |
| 4,615,905 | 10/1986 | Ovshinsky | 427/39 |
| 4,637,938 | 1/1987 | Lee et al. | 427/53.1 |
| 4,650,539 | 3/1987 | Irvine et al. | 156/613 |
| 4,652,463 | 3/1987 | Peters | 427/53.1 |

FOREIGN PATENT DOCUMENTS 2038086  7/1980  United Kingdom ............... 427/87

Primary Examiner—Sadie L. Childs
Attorney, Agent, or Firm—Fitzpatrick, Cella Harper & Scinto

[57] ABSTRACT

A method for forming a deposited film comprises introducing a gaseous starting material containing silicon and/or germanium atoms; a starting material containing at least one member selected from the group consisting of aluminum (Al), molybdenum (Mo), tungsten (W), titanium (Ti), and tantalum (Ta), which is capable of being converted to gaseous state; and a gaseous halogenic oxidizing agent which exerts an oxidative effect on the said starting materials for film formation, into a reaction space to effect contact therebetween to thereby chemically form a plural number of precursors containing precursors under excited state, and forming a deposited film on a substrate existing in a film-forming space by the use of at least one precursors of said percursors as the feeding source for the constituent element of the deposited film.

17 Claims, 1 Drawing Sheet

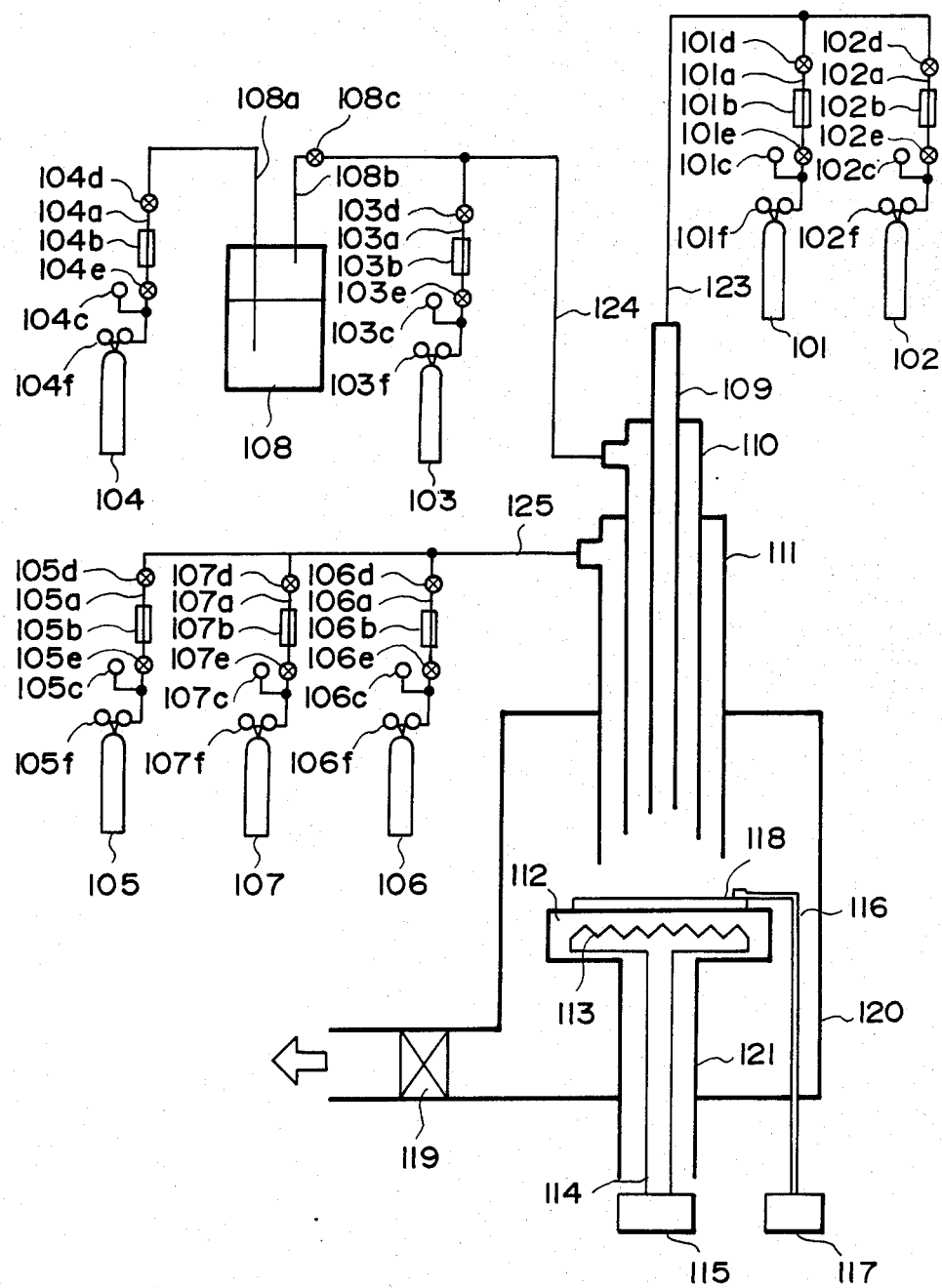
F I G. 1

METHOD FOR FORMING DEPOSITED FILM BY GENERATING PRECURSOR WITH HALOGENIC OXIDIZING AGENT

BACKGROUND OF THE INVENTION

1. Field of the Invention

The present invention relates to a method for forming a functional film, in particular a functional deposited film applied to electronic devices such as semiconductor devices, photosensitive devices for electrophotography, and optical input sensor devices for an apparatus to which optical images are inputted.

2. Related Background Art

Up to now, a functional film composed of amorphous or polycrystalline structure, such as semiconductor films, insulating films, photoconductive films, magnetic films or metal films has conventionally been formed according to an individual, suitable film-forming method in the light of desired physical properties or applications thereof.

As methods for forming deposited films, there have conventionally been attempted vacuum deposition method, plasma CVD method, thermal CVD method, photo-CVD method, reactive sputtering technique, ion-plating method, etc. and the Plasma-CVD technique is, in general, widely utilized and industrialized.

However, there still remains room for synthetically improving these deposited films, formed according to the methods as listed above, in particular in their properties such as electrical, optical properties, fatigue property in the case where it is used repeatedly and resistance to environment as well as productivity and mass productivity inclusive of uniformity and reproducibility, since it has recently been intended that these deposited films are applied to electronic devices and photoelectronic devices which are expected to have more improved higher functions.

The reaction processes for forming a deposited film according to a conventional Plasma CVD method widely utilized are quite complicated compared with the conventional so-called Thermal CVD method and further there are not a few vague points in its reaction mechanisms.

Moreover, there are a large number of parameters for formation of a deposited film (for example, substrate temperature, flow rate and flow rate ratio of introduced gases, pressure during the formation of the film, high-frequency power, electrodes structure, reaction vessel structure, evacuation rate, and plasma generating system, etc.) Because of the combination of such a large number of parameters, the plasma may sometimes become unstable state, whereby marked deleterious influences were exerted frequently on the deposited film formed. In addition to those mentioned above, the parameters specific to such apparatuses for depositing functional films should be selected depending on each of them and therefore, it has practically been quite difficult to generalize the conditions for film-forming processes or apparatuses.

In particular, it has practically been believed to be optimum that a film of III–V compound semiconductor should be deposited according to Plasma-CVD method. This is because this method makes it possible to impart sufficient electric and optical properties suitable for each applications to the resulting deposited films.

However, a vast facility investment is required to establish an apparatus which permits the mass production of deposited films when the deposited film is formed according to Plasma-CVD method, since it is sometimes required to achieve mass productivity and a good reproducibility while sufficiently satisfying the requirements with respect to the enlargement of deposited area, uniformity in the film thickness, and uniformity in the quality of the deposited film. Furthermore, items of control required to attain mass production become complicated, tolerance of control becomes narrower and a delicate adjustment of the apparatus for depositing functional films is required. Under these circumstances, it has been pointed out that these problems should effectively be solved in the future.

On the other hand, a conventional technique principally relying on the well known CVD technique requires a relatively high temperature to form a deposited film and seldom provides a deposited film satisfying the requirements of properties which are commercially acceptable.

These problems accompanied by the conventional film-forming techniques still remain unsolved and these problems have been expected to be eliminated. The elimination of them is quite important, in particular, in producing an electrically conductive thin film composed of aluminum (Al)-, molybdenum (Mo)-, tungsten (W)-, titanium (Ti)-, or tantalum (Ta)-containing compounds.

As already explained above, it has eagerly been expected, in formation of functional films, to develop a method for forming a deposited film, which is capable of mass production by means of an apparatus of low cost, while maintaining the practically acceptable properties of the deposited film and the uniformity thereof.

SUMMARY OF THE INVENTION

An object of the present invention is to eliminate the disadvantages accompanied by the conventional deposited film-forming methods and to provide a new method for forming a deposited film.

Another object of the present invention is to provide a method for forming a deposited film, which permits the energy saving and the simplification of the quality control of the resulting film and which can provide a deposited film having uniform properties over an wide area.

A further object of the present invention is to provide a method for forming a deposited film by which a film excellent in the productivity and mass productivity having a high quality as well as excellent physical properties such as electrical, optical, semiconductor property can be easily obtained.

The above mentioned and other purposes of the present invention can be accomplished by a new method for forming a deposited film which is characterized by introducing a gaseous starting material containing silicon (Si) and/or germanium (Ge) atoms; a starting material containing at least one member selected from the group consisting of Al, Mo, W, Ti, Ta, Cr, which is capable of being converted to gaseous state; and a gaseous halogenic oxidizing agent which exerts an oxidative effect to the starting materials into a reaction space to effect contact therebetween to thereby chemically form a plural number of precursors containing precursors under excited state, and forming a deposited film on a substrate existing in a film-forming space by the use of at least one precursor of said precursors as the feeding source for the constituent element of the deposited film.

BRIEF DESCRIPTION OF THE DRAWING

FIG. 1 is a schematic illustration of a film forming apparatus used in Examples of the present invention.

DESCRIPTION OF THE PREFERRED EMBODIMENTS

According to the method for forming a deposited film of the present invention, simplification of control and mass production can be effected with full satisfaction of enlargement of area, uniformity of film thickness, and uniformity of film quality simultaneously with saving energy, without requiring vast facility investment for mass production apparatus, and also the control items for its mass production become clear to afford broad width of control tolerance and simple adjustment of the apparatus.

In the method for forming a deposited film of the resent invention, the gaseous starting material containing Si and/or Ge atoms and the starting material capable of being converted to gaseous state and containing at least one member selected from the group consisting of Al, Mo, W, Ti, Ta, Cr as used in the method of the present invention are oxidized when they come into contact with a gaseous halogenic oxidizing agent and may be suitably selected depending on the kind of the deposited films intended, their properties, their applications and the like. In the present invention, the starting material capable of being converted to gaseous state and the gaseous halogenic oxidizing agent may be any materials which can be converted to gaseous state when they come into contact with each other and they ay be in gaseous, liquid or solid in ordinary state.

When the starting material for forming deposited films or the halogenic oxidizing agent are in the form of liquid or solid, they are introduced into a reaction space in gaseous state while performing bubbling with use of carrier gas such as Ar, He, $N_2$, $H_2$. etc., optionally with application of heat.

At this state, the partial pressures and the mixing ratio of the above gaseous starting materials and the above gaseous halogenic oxidizing agent can be set by adjusting the flow rate of the carrier gas and the vapour pressures of the starting materials for forming deposited films and the gaseous halogenic oxidizing agent.

The starting material for forming deposited films includes chain (linear or branched chain) or cyclic silane compounds and examples of the starting compound capable of being converted to gaseous state and containing Al, Mo, W, Ti, Ta, and Cr include alkylated compounds, halides, oxygen-containing compounds thereof.

More particularly, the examples of the linear silane compound include the compounds represented by the following general formula:

$Si_n H_{2n+2}$ 

wherein n is an integer of from 1 to 8, examples of the branched chain silane compound include the compounds represented by the following formula:

$SiH_3SiH(SiH_3)SiH_2SiH_3$ 

and examples of the cyclic silane compound include the compounds of the following general formula:

$Si_n H_{2n}$ 

wherein n is an integer of from 3 to 6.

As the Al compounds, there may be exemplified compounds such as $AlCl_3$, $AlBr_3$, $AlI_3$, $Al(CH_3)_2Cl$, $Al(CH_3)_3$, $Al(OCH_3)_3$, $Al(CH_3)Cl_2$, $Al(C_2H_5)_3$, $Al(OC_2H_5)_3$, $Al(CH_3)Cl$, $Al(i-C_4H_9)_3$, $Al(i-C_3H_7)_3$, $Al(n-C_3H_7)_3$, $Al(OC_4H_9)_3$.

As the Mo compounds, there may be exemplified compounds such as $MoCl_5$, $MoCl_4O$, $MoCl_2O_2$.

Examples of the Mn compounds include $MnH(CO)_5$, $Mn(CO)_4(C_3H_5)$, $Mn(CO)_3(C_5H_5)$.

Examples of the Ti compounds include $TiBr_4$, $Ti(OC_4H_9)_4$, $Ti(OCH_3)_4$, $Ti(OC_2H_5)_4$, $Ti(OC_3H_7)_4$.

As examples of the Ta compounds, there may be exemplified compounds such as $TaF_5$, $Ta(OC_3H_7)_5$, $TaCl_5$, $Ta(OCH_3)_5$, $Ta(OC_2H_5)_5$.

Examples of the W compounds include $WF_4O$, $WCl_4O$, $WBr_4O$.

Examples of the Cr compounds include $CrO_2Cl_2$.

As the chain germanium compounds, there may be exemplified compounds such as those represented by the following general formula:

$Ge_m H_{2m+2}$ 

wherein m is an integer of from 1 to 5.

The halogenic oxidizing agent as used herein is converted to gaseous state when it is introduced into a reaction space and exerts an effective oxidative effect on the gaseous starting materials for forming deposited films simultaneously introduced into the reaction space by mere contact therewith, including a halogen gas such as $F_2$, $Cl_2$, $Br_2$, $I_2$, etc., and fluorine, chlorine, bromine etc., in the nascent state as effective ones.

These halogenic oxidizing agents and the starting materials are introduced in the reaction space in each desired flow rate and feeding pressure, in which the starting materials and the oxidizing agent are mixed with each other and cause collisions and contact therebetween to thereby effectively generate a plurality of precursors including those in the excited condition due to the oxidative effect of the oxidizing agent.

Of the precursors under excited state and other precursors generated, at least one of them functions as the feeding source for the constituent element of the deposited film formed. The precursors generated are decomposed or reacted to convert to different kind of precursors under exited state or to precursors under different excited state or they remain as they are, while eventually emit energy. These precursors come into contact with the substrate surface placed in the film-forming space, whereby a deposited film having a three-dimensional network is prepared.

In the present invention, so that the deposit film forming process may proceed smoothly to form a film of high quality and having desired physical characteristics, as the film forming factors, the kinds and combination of the starting materials and the halogenic oxidizing agent, mixing ratio of these, pressure during mixing, flow rate, the inner pressure in the film forming space, the flow types of the gases, the film-forming temperature (substrate temperature and atmosphere temperature) are suitably selected as desired. These film-forming factors are organically related to each other, and they are not determined individually but determined respectively under mutual relationships. In the present invention, the ratio of the gaseous starting materials for formation of a deposited film and the gaseous halogenic oxidizing agent introduced into the reaction space may be determined suitably as desired in relationship of the film-forming factors related among the film-forming factors as mentioned above. The ratio is preferably 1/20 to 100/1, more preferably 1/5–50/1 in terms of flow rate ratio introduced.

The pressure during mixing on the introduction into the reaction space may be preferably higher in order to make higher the contact between the above gaseous starting materials and the above gaseous halogenic oxidizing agent in probability. It is better to determine the optimum value suitably as desired in view of the reactivity. Although the pressure during mixing may be determined as described above, each of the pressure during introduction may be preferably $1 \times 10$ atm to 5 atm, more preferably $1 \times 10-6$ atm to 2 atm.

The pressure within the film forming space, namely the pressure in the space in which the substrate for forming a film thereon is arranged may be set suitably as desired so that the precursors (E) under the state generated in the reaction space and sometimes the precursors (D) formed as secondary products from said precursors (E) may contribute effectively to film formation.

The inner pressure in the film-forming space, when the film-forming space is openly continuous to the reaction space, can be controlled in relationship with the introduction pressures and flow rates of the gaseous starting materials for formation of a deposited film and a gaseous halogenic oxidizing agent in the reaction space, for example, by application of a contrivance such as differential evacuation or use of a large scale evacuating apparatus.

Alternatively, when the conductance at the connecting portion between the reaction space and the film-forming space is small, the pressure in the film-forming space can be controlled by providing an appropriate evacuating apparatus in the film-forming space and controlling the evacuation amount of said apparatus.

On the other hand, when the reaction space and the film-forming space is integrally made and the reaction position and the film-forming position are only spatially different, it is possible to effect differential evacuation or provided a large scale evacuating apparatus having sufficient evacuating capacity as described above.

As described above, the pressure in the film-forming space may be determined in the relationship with the introduction pressures of the gaseous starting materials and the gaseous halogenic oxidizing agent introduced into the reaction space. The pressure is preferably 0.001 Torr to 100 Torr, more preferably 0.01 Torr to 30 Torr, optimally 0.05 to 10 Torr.

As for the flow type of the gases, it is necessary to design the flow type in view of the geometric arrangement of the gas introducing inlet, the substrate, and the gas evacuating outlet so that the starting materials for formation of a deposited film and the halogenic oxidizing agent may be efficiently mixed during introduction of these into the reaction space, the above precursors (E) may be efficiently generated and the film formation may be adequately carried out without trouble. A preferable example of the geometric arrangement is shown in FIG. 1.

As the substrate temperature (Ts) during the film formation, it can be set suitably as desired individually depending on the gas species employed, and the kinds and the required characteristics of the deposited film formed. In the case of obtaining a silicide film, it is preferably from room temperature to 900° C., more preferably from 100° to 900° C. Particularly, in the case of forming a silicide film having better conductive characteristics, the substrate temperature (Ts) should desirably be made 500° to 700° C.

As the atmosphere temperature (Tat) in the film-forming space, it may be determined suitably as desired in the relationship with the substrate temperature (Ts.) so that the above precursors (E) generated and the above precursors (D) can not be changed to unsuitable chemical species for film formation, and also the above precursors (E) may be efficiently generated.

The substrate to be used in the present invention may be either electroconductive or electrically insulating, provided that it is selected as desired depending on the use of the deposited film formed. As the electroconductive substrate, there may be mentioned metals such as NiCr, stainless steel, Al, Cr, Mo, Au, Ir, Nb, Ta, V, Ti, Pt, Pd, etc. or alloys thereof.

As insulating substrates, there may be conventionally used films or sheets of synthetic resins, including polyester, polyethylene, polycarbonate, cellulose acetate, polypropylene, polyvinyl chloride, polyvinylidene chloride, polystyrene, polyamide, etc., glasses, ceramics and so on. At least one side surface of these substrates is preferably subjected to a treatment for imparting electroconductivity, and it is desirable to provide other layers on the side at which said electroconductive treatment has been applied.

For example, an electroconductive treatment of glass can be effected by providing a thin film of NiCr, Al, Cr, Mo, Au, Ir, Nb, Ta, V, Ti, Pt, Pd, $In_2O_3$, $SnO_2$, ITO ($In_2O_3 + SnO_2$) on the surface thereof. Alternatively, a synthetic resin film such as a polyester film can be subjected to the electroconductive treatment on its surface by the vacuum vapor deposition, the electron-beam deposition or the sputtering of a metal such as NiCr, Al, Ag, Pb, Zn, Ni, Au, Cr, Mo, Ir, Nb, Ta, V, Ti, Pt, etc., or by a laminating treatment with said metal, thereby imparting electroconductivity to the surface. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion between both is great, a large amount of strains may be created within the film to give sometimes no film of good quality, and therefore it is preferable to use a substrate so that the difference in thermal expansion between both is small.

Also, the surface state of the substrate is directly related to the structure of the film (orientation) or generation of a stylet structures, and therefore it is desirable to treat the surface of the substrate so that a film structure and a film texture which give desired characteristics may be obtained.

FIG. 1 shows an example of a preferable apparatus for practicing the method for forming a deposited film of the present invention.

The deposited film forming apparatus shown in FIG. 1 is broadly classified into the three of a main apparatus, an evacuation system and a gas feeding system.

In the main device, a reaction space and a film forming space are provided.

101–107 are respectively bombs filled with the gases to be used during the film formation, 101a–107a are respectively gas feeding pipes, 101b–107b are respectively mass flow controllers for controlling the flow rates of the gases from the respective bombs, 101c–107c are respectively gas pressure gauges, 101d–107d and 101e–107e are respectively valves, and 101f–107f are respectively pressure gauges indicating the pressures in the corresponding gas bombs.

108 is vessel for containing liquid and solid starting materials having heating means (not shown in this FIG.) to be used, if necessary, 108b gas feeding pipe, and 108c valve.

120 is a vacuum chamber equipped at the upper portion with a pipeline for gas introduction, having a structure for formation of the reaction space downstream of the pipeline, and also having a structure for formation of a film-forming space in which a substrate holder 112 is provided so that a substrate 118 may be provided as opposed to the gas discharging outlet of said pipeline. The pipeline for gas introduction has a triple concentric arrangement structure, having from the innerside a first gas introducing pipe 109 for introducing the gases from the gas bombs 101, 102, a second gas introducing pipe 110 for introducing the gases from the gas bombs 103, 104, and a third gas introducing pipe 111 for introducing the gases from the gas bombs 105–107.

For gas evacuation to the reaction space of each gas introducing pipe, each position is designed so as to be arranged at a position further from the surface position of the substrate as the pipe is nearer to the inner side. In other words, the gas introducing pipes are arranged so that the pipe on the outer side may enclose the pipe existing within the innerside thereof.

The gases from the respective bombs are fed into the respective introducing pipes through the gas feeding pipelines 123–125, respectively.

The respective gas introducing pipes, the respective gas feeding pipelines, and the vacuum chamber 120 are evacuated to vacuum through the main vacuum valve 119 by means of a vacuum evacuating apparatus not shown.

The substrate 118 is set at a suitable from desired distance from the positions of the respective gas introducing pipes by moving vertically the substrate holder 112.

In the case of the present invention, the distance between the substrate and the gas discharging outlet of the gas introducing pipe may be determined appropriately in view of the kids and the desired characteristics of the deposited film formed, the gas flow rates, the inner pressure in the vacuum chamber, etc. It is preferably several mm to 20 cm, more preferably 5 mm to about 15 cm.

113 is a heater for heating the substrate which is provided in order to heat the substrate to an appropriate temperature during film formation, or to preheat the substrate 118 before film formation or further to anneal the film after film formation.

The substrate heating heater 113 is supplied with power through a conductive wire 114 from a power source 115.

116 is a thermocouple for measuring the substrate temperature (Ts) and is electrically connected to the temperature display device 117.

The present invention described in more detail by referring to the following Examples.

EXAMPLE 1

By use of the film forming apparatus shown in FIG. 1, a deposited film was prepared according to the process of the present invention as described below. In this example, the formation of aluminum silicide film is illustrated.

He gas as the carrier charged in the bomb 104 was introduced into $Al(CH_3)_3$ contained in Dewar vessel 108 and bubbled therethrough to form He gases saturated with $Al(CH_3)_3$ and then the resulting gases were introduced into a chamber 120 through the gas inlet 110.

On the other hand, $SiH_4$ charged in the bomb 101 was introduced into the chamber 120 from the gas inlet 109 through the conduit 123.

$F_2$ gas was used for the gaseous halogen exerting oxidative effect on the starting materials and introduced into chamber 120 from the bomb 106 charged therewith through the conduit 125.

At this stage, the internal pressure of the chamber 120 was controlled to 0.5 Torr by adjusting the vacuum valve 119. A quartz glass (2 cm × 2 cm) was used for the substrate. The distance between the substrate and the gas conduit 111 was set at 3 cm.

Table 1 shows the characteristics when the flow rate of $Al(CH_3)_3$/He is changed.

When the conditions such as flow rate inner pressure and substrate temperature were set as indicated in the Table, the relationship among deposition rate, film thickness and resistivity shown in the Table was obtained. The film thickness was measure with a film thickness measuring apparatus of ALPHA STEP (manufactured by TENCOR Co.)

TABLE 1

| Example No. | Starting Gas | Flow Rate (SCCM) | Internal Pressure (Torr) | Substrate Temperature (°C.) | Deposition Rate (Å/s) | Film thickness (μ) | Resistivity (Ω cm) |
|---|---|---|---|---|---|---|---|
| 1 | $F_2$<br>He<br>$SiH_4$<br>$Al(CH_3)_3$/He | 1<br>10<br>1<br>$Al(CH_3)_3 = 1$ | 0.7 | 250 | 0.05 | 0.02 | 50 |
| 2 | $F_2$<br>He<br>$SiH_4$<br>$Al(CH_3)_3Cl_3$<br>He | 0.5<br>10<br>0.5<br>$Al(CH_3)_3Cl_3 = 0.5$ | 0.8 | 270 | 0.023 | 0.018 | 2 |
| 3 | $F_2$<br>He<br>$SiH_4$<br>$Al(C_3H_7)_3$<br>He | 2.0<br>20<br>0.5<br>$Al(C_3H_7)_3 = 1.0$ | 0.9 | 230 | 0.07 | 0.015 | 100 |

The measurement of the resistivity was carried out by depositing comb-shaped electrodes of Al (gap length:

200 μm) on each deposited film formed to obtain a specimen for measuring resistivity, applying 100 V to each specimen contained in a vacuum cryostat and measuring a current by a microammeter (YHP 4140B) to calculate resistivity ρ.

EXAMPLE 3

An aluminum germanide film was prepared according to the same condition and procedure as Example 1 except for substituting $GeH_4$ for $SiH_4$. The obtained film had resistivity of 0.05 Ω·cm and also high quality.

TABLE III

| Example No. | Starting Gas | Flow Rate (SCCM) | Internal Pressure (Torr) | Substrate Temperature (°C.) | Deposition Rate (Å/s) | Film Thickness (μm) | Resistivity (Ω cm) |
|---|---|---|---|---|---|---|---|
| 5 | $F_2$<br>He<br>$SiH_4$<br>$WCl_6$ | 1<br>10<br>1<br>1 | 0.7 | 400 | 0.1 | 0.02 | $1.4 \times 10^{-1}$ |

TABLE IV

| Example No. | Starting Gas | Flow Rate (SCCM) | Internal Pressure (Torr) | Substrate Temperature (°C.) | Deposition Rate (Å/s) | Film Thickness (μm) | Resistivity (Ω cm) |
|---|---|---|---|---|---|---|---|
| 6 | $F_2$<br>He<br>$SiH_4$<br>$TiCl_4$ | 1<br>10<br>1<br>1 | 0.9 | 200 | 0.1 | 0.2 | $10^{-3}$ |

TABLE V

| Example No. | Starting Gas | Flow Rate (SCCM) | Internal Pressure (Torr) | Substrate Temperature (°C.) | Deposition Rate (Å/s) | Film Thickness (μm) | Resistivity (Ω cm) |
|---|---|---|---|---|---|---|---|
| 7 | $F_2$<br>He<br>$SiH_4$<br>$TaCl_5$ | 1<br>10<br>1<br>1 | 0.5 | 300 | 0.1 | 0.02 | 10 |

EXAMPLE 2

According to the procedures similar to those in the example 1, a molybdenum silicide film was formed utilizing the apparatus shown in FIG. 1. In this example, $MoCL_5$ was charged to the Dewar vessel 108 and bubbled with He gas charged in the bomb 104 as the carrier which was passed therethrough and then the resulting gas was introduced into the chamber 120.

Table II shows the conditions, i.e., the flow rate of the starting gases, the internal pressure and the temperature of the substrate and the results on the deposition rate, the film thickness and the resistivity.

TABLE II

| Example No. | Starting Gas | Flow Rate (SCCM) | Internal Pressure (Torr) | Substrate Temperature (°C.) | Deposition Rate (Å/s) | Film Thickness (μm) | Resistivity (Ω cm) |
|---|---|---|---|---|---|---|---|
| 4 | $F_2$<br>He<br>$SiH_4$<br>$MoCl_5$ | 1<br>10<br>1<br>1 | 0.5 | 300 | 0.1 | 0.02 | $2 \times 10^{-1}$ |

According to the procedures similar to those described above, tungsten silicide film, titanium silicide film and tantalum silicide film were prepared under the film-forming conditions shown in Tables III to V.

As can be seen from the detailed description and the respective examples as set forth above, according to the deposition film forming method of the present invention, deposited films having uniform physical properties over a large area can be obtained with easy management of film quality at the same time as achievement of energysaving. Also, it is possible to obtain easily films excellent in productivity and mass productivity, and having high quality with excellent electrical properties.

We claim:

1. A method for forming a deposited silicide and/or germanide film without the assistance of plasma discharge, comprising:
    introducing into reaction space (a) a gaseous first starting material, (b) a second starting material capable of being converted to a gaseous state, and (o) a gaseous halogenic oxidizing agent capable of exerting an oxidation effect on said starting materials; said gaseous first starting material being selected from the group consisting of silicon-containing compounds, germanium-containing compounds and mixtures thereof; said second starting material containing at least one metal selected from the group consisting of Al, Mo, W, Ti, Ta and Cr; said gaseous halogenic oxidizing agent being selected from the group consisting of $F_2$, $Cl_2$, $Br_2$ and $I_2$;

allowing said starting materials and said gaseous halogenic oxidizing agent to mix and contact each other thereby forming without the use of external energy a plurality of precursors including precursors in an excited state; and feeding at least one of said precursors into a film-forming space containing a substrate to form said deposited film on said substrate.

2. A method according to claim 1, wherein the gaseous starting material is a chain silane compound.

3. A method according to claim 2, wherein the chain silane compound is a linear silane compound.

4. A method according to claim 3, wherein the linear silane compound is represented by the general formula:

$$SinH_nH_{2n+2}$$

(wherein n is an integer of 1 to 8).

5. A method according to claim 2, wherein the chain silane compound is a branched chain silane compound.

6. A method according to claim 1, wherein the gaseous starting material is a silane compound having a cyclic structure of silicon.

7. A method according to claim 1, wherein the gaseous starting material is a germanium compound.

8. A method according to claim 7, wherein the germanium compound is represented by the general formula:

$$Ge_mH_mH_{2m+2}$$

(wherein m is an integer of 1 to 5).

9. A method according to claim 1, wherein the gaseous starting material is a hydrogenated silicon compound.

10. A method according to claim 1, wherein the gaseous starting material is a tetrahedral system compound.

11. A method according to claim 1, wherein the gaseous halogenic oxidizing agent is under nascent state.

12. A method according to claim 1, wherein the substrate is arranged at a position opposed to the direction in which the gaseous starting materials and the gaseous halogenic oxidizing agent are introduced into the reaction space.

13. A method according to claim 1, wherein the gaseous starting materials and the gaseous halogenic oxidizing agent are introduced into the reaction space through transporting pipe of a multi-tubular structure.

14. A method according to claim 1, wherein the forming of said deposited film is accompanied with luminescence.

15. A method according to claim 1, wherein said second starting material is an organometallic compound.

16. A method according to claim 1, wherein said second starting material is a hydrogenated compound.

17. A method according to claim 1, wherein said second starting material is a halide.

* * * * *

UNITED STATES PATENT AND TRADEMARK OFFICE
CERTIFICATE OF CORRECTION

PATENT NO. : 4,861,623

DATED : August 29, 1989

INVENTOR(S) : MASAO UEKI, ET AL.

It is certified that error appears in the above-identified patent and that said Letters Patent is hereby corrected as shown below:

ON THE TITLE PAGE:

IN [54] TITLE

Line 2, "PRECURSOR" should read --PRECURSORS--.

IN [57] ABSTRACT

Line 14, "precursors" should read --precursor--.

COLUMN 1

Line 3, "PRECURSOR" should read --PRECURSORS--.
Line 53, "state" should be deleted.

COLUMN 3

Line 18, "resent" should read --present--.
Line 31, "ay" should read --may--.
Line 37, "$H_2$." should read --$H_2$,--.
Line 63, "Sin $H_{2n}$" should read --$Si_n H_{2n}$--.
Line 67, "$AlCl_3$," should read --$AlCl_3$,--.
Line 68, "$Al(CH_3)Cl_2$," should read --$Al(CH_3)Cl_2$,--.

COLUMN 4

Line 45, "emit" should read -emitting--.

UNITED STATES PATENT AND TRADEMARK OFFICE
CERTIFICATE OF CORRECTION

PATENT NO. : 4,861,623
DATED : August 29, 1989
INVENTOR(S) : MASAO UEKI, ET AL.

It is certified that error appears in the above-identified patent and that said Letters Patent is hereby corrected as shown below:

COLUMN 5

Line 11, "1 X 10 atm" should read --1 X $10^{-7}$ atm--.
    Line 12, "1 X 10-6 atm" should read --1 X $10^{-6}$ atm--.
    Line 39, "provided" should read --provide--.

COLUMN 7

Line 36, "from" should be deleted.
    Line 43, "kids" should read --kinds--.

COLUMN 8

Line 10, "described" should read --is described--.

COLUMN 9

Line 41, "example 1," should read --Example 1,--.

COLUMN 10

Line 45, "gysaving" should read --gy-saving--.

UNITED STATES PATENT AND TRADEMARK OFFICE
CERTIFICATE OF CORRECTION

PATENT NO. : 4,861,623
DATED : August 29, 1989
INVENTOR(S) : MASAO UEKI, ET AL.

It is certified that error appears in the above-identified patent and that said Letters Patent is hereby corrected as shown below:

COLUMN 12

Line 5, "$GemH_mH_{2m+2}$" should read --$Ge_mH_{2m+2}$--.

Signed and Sealed this

Tenth Day of November, 1992

*Attest:*

DOUGLAS B. COMER

*Attesting Officer*  *Acting Commissioner of Patents and Trademarks*